United States Patent
Chi et al.

(10) Patent No.: US 9,929,020 B2
(45) Date of Patent: Mar. 27, 2018

(54) METHOD FOR FIN FORMATION WITH A SELF-ALIGNED DIRECTED SELF-ASSEMBLY PROCESS AND CUT-LAST SCHEME

(71) Applicants: International Business Machines Corporation, Armonk, NY (US); GlobalFoundries, Inc., Grand Cayman (KY)

(72) Inventors: Cheng Chi, Jersey City, NJ (US); Fee Li Lie, Albany, NY (US); Chi-Chun Liu, Altamont, NY (US); Ruilong Xie, Albany, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/363,596

(22) Filed: Nov. 29, 2016

(65) Prior Publication Data
US 2017/0092507 A1    Mar. 30, 2017

Related U.S. Application Data

(62) Division of application No. 14/870,932, filed on Sep. 30, 2015, now Pat. No. 9,536,750.

(51) Int. Cl.
| | |
|---|---|
| H01L 21/30 | (2006.01) |
| H01L 21/31 | (2006.01) |
| H01L 21/82 | (2006.01) |
| H01L 21/308 | (2006.01) |
| H01L 21/311 | (2006.01) |
| H01L 21/8234 | (2006.01) |

(52) U.S. Cl.
CPC ...... *H01L 21/3086* (2013.01); *H01L 21/3081* (2013.01); *H01L 21/31144* (2013.01); *H01L 21/823431* (2013.01)

(58) Field of Classification Search
CPC ..................................................... H01L 21/308
USPC ............................................................ 257/622
See application file for complete search history.

(56) References Cited

U.S. PATENT DOCUMENTS

| | | | |
|---|---|---|---|
| 2015/0170926 A1* | 6/2015 | Michalak | H01L 23/5329 257/734 |
| 2016/0064239 A1* | 3/2016 | Shih | H01L 21/0273 438/694 |
| 2016/0240386 A1* | 8/2016 | Syun | H01L 21/0206 |

\* cited by examiner

*Primary Examiner* — Moazzam Hossain
*Assistant Examiner* — Omar Mojaddedi
(74) *Attorney, Agent, or Firm* — Cantor Colburn LLP; Vazken Alexanian

(57) ABSTRACT

A method of making a semiconductor device includes disposing a first hard mask (HM), amorphous silicon, and second HM on a substrate; disposing oxide and neutral layers on the second HM; removing a portion of the oxide and neutral layers to expose a portion of the second HM; forming a guiding pattern by selectively backfilling with a polymer; forming a self-assembled block copolymer (BCP) on the guiding pattern; removing a portion of the BCP to form an etch template; transferring the pattern from said template into the substrate and forming uniform silicon fin arrays with two types of HM stacks with different materials and heights; gap-filling with oxide followed by planarization; selectively removing and replacing the taller HM stack with a third HM material; planarizing the surface and exposing both HM stacks; and selectively removing the shorter HM stack and the silicon fins underneath.

20 Claims, 15 Drawing Sheets

METHOD FOR FIN FORMATION WITH A SELF-ALIGNED DIRECTED SELF-ASSEMBLY PROCESS AND CUT-LAST SCHEME

PRIORITY

This application is a divisional of and claims priority from U.S. patent application Ser. No. 14/870,932, filed on Sep. 30, 2015, entitled "A METHOD FOR FIN FORMATION WITH A SELF-ALIGNED DIRECTED SELF-ASSEMBLY PROCESS AND CUT-LAST SCHEME," the entire contents of which are incorporated herein by reference.

BACKGROUND

The present invention relates to semiconductors, and more specifically, to semiconductor fin patterning.

Device scaling drives the semiconductor industry, which reduces costs, decreases power consumption, and provides faster devices with increased functions per unit area. Improvements in optical lithography have played a role in device scaling. However, optical lithography may have limitations for minimum dimensions, which are determined by the wavelength of the irradiation.

Directed self-assembly (DSA) is an alternative method for forming periodic structures, such as one-dimensional arrays of semiconductor line structures. In order to convert the array of semiconductor line structures into semiconductor fins, portions of the semiconductor line structures are etched away by employing lithographic stacks. DSA of block copolymers (BCPs) employs a topographical or chemical guiding pattern to direct the BCPs into a desired morphology at a pre-determined location. BCPs are made up of two or more chemically distinct homopolymers covalently bonded at one end. Such a material is capable of micro-phase segregation under proper annealing conditions, i.e., self-assemble into periodic structures with critical dimensions of tens of nanometers. The BCP material properties control the feature size and uniformity of the resulting structures.

In one example, di-block copolymers, for example polystyrene (PS)/poly(methyl methacrylate) (PMMA), BCPs can be used to pattern fins. The PS and PMMA blocks define where the fins and spaces between the fins are arranged, respectively. Reactive ion etching (RIE) may then remove the PMMA block and reduce the critical dimensions (CD) of the fins to achieve the final fin CD.

SUMMARY

According to an embodiment, a method of making a semiconductor device includes disposing a hard mask stack on a substrate, the hard mask stack including a first hard mask layer in contact with the substrate, an amorphous silicon layer on the first hard mask layer, and a second hard mask layer on the amorphous silicon layer; disposing an oxide layer and a neutral layer on the second hard mask layer; removing a portion of the oxide layer and the neutral layer to expose a portion of the second hard mask layer; forming a guiding pattern by selectively backfilling a polymeric material in the exposed portion of the second hard mask layer, the guiding patterning including the neutral layer and the polymeric material; forming a block copolymer layer on the guiding pattern; removing a portion of the block copolymer to form an etch template including polymers that are remaining; etching the neutral layer, the oxide layer, the second hard mask layer, the amorphous silicon layer, and the first hard mask layer to transfer a pattern from the etch template into the neutral layer, the oxide layer, the second hard mask layer, the amorphous silicon layer, and the first hard mask layer; and etching the substrate to transfer the pattern from the hard mask stack into the substrate and form a first fin including a first portion of the first hard mask layer disposed on the first fin and a second fin including a second portion of the first hard mask layer disposed on the second fin, the second portion being thicker than the first portion.

According to another embodiment, a method of making a semiconductor device includes disposing a hard mask stack on a substrate, the hard mask stack including a first hard mask layer in contact with the substrate, an amorphous silicon layer on the first hard mask layer, and a second hard mask layer on the amorphous silicon layer; disposing an oxide layer and a neutral layer on the second hard mask layer; removing a portion of the oxide layer and the neutral layer to expose a portion of the second hard mask layer; forming a guiding pattern by selectively backfilling a polymeric material in the exposed portion of the second hard mask layer; forming a block copolymer layer on the guiding pattern, the guiding pattern including the neutral layer and the polymeric material that is backfilled; removing a portion of the block copolymer layer to form an etch template with polymers that are remaining; etching the neutral layer, the oxide layer, the second hard mask layer, the amorphous silicon layer, and the first hard mask layer to transfer a pattern from the etch template into the neutral layer, the oxide layer, the second hard mask layer, the amorphous silicon layer, and the first hard mask layer; etching the substrate to transfer the pattern from the hard mask stack into the substrate and form a first fin including a first portion of the first hard mask layer disposed on the first fin and a second fin including a second portion of the first hard mask layer disposed on the second fin, the second portion being thicker than the first portion; replacing the second portion of the first hard mask layer on the second fin with a third hard mask material; and etching to remove the first fin.

Yet, according to another embodiment, a semiconductor device includes a first fin and a second fin disposed on a substrate; a first hard mask disposed on the first fin; a second hard mask disposed on the second fin; wherein the thickness of the first hard mask is different than the thickness of the second hard mask.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-15 illustrate exemplary methods of making semiconductor devices according to various embodiments, in which:

FIG. 1 is a cross-sectional side view of a semiconductor stack including a neutral layer, an oxide layer, and a hard mask stack disposed over a substrate;

FIG. 2 is a cross-sectional side view after disposing a resist on the neutral layer;

FIG. 3 is a cross-sectional side view after etching the neutral layer and the oxide layer and removing the resist;

FIG. 4 is a cross-sectional side view after disposing a block copolymer (BCP) on the neutral layer and the hard mask stack;

FIG. 5 is a cross-sectional side view after removing one polymer block from the BCP and etching the second hard mask layer, oxide layer, and neutral layer beneath;

FIG. 6 is a cross-sectional side view after etching the amorphous silicon layer;

FIG. 7 is a cross-sectional side view after etching the first hard mask layer;

FIG. 8 is a cross-sectional side view after etching the substrate to form fins;

FIG. 9 is a cross-sectional side view after depositing a gap-filling oxide layer on and between the fins followed by a planarization process, such as chemical mechanical planarization (CMP);

FIG. 10 is a cross-sectional side view after removing the exposed amorphous silicon and hard mask layer;

FIG. 11 is a cross-sectional side view after disposing an insulating layer (third hard mask layer) on the oxide layer;

FIG. 12 is a cross-sectional side view after etching the insulating layer and the oxide layer to expose the first hard mask layer;

FIG. 13 is a cross-sectional side view after removing the first hard mask layer using a selective process;

FIG. 14 is a cross-sectional side view after etching the substrate by a selective etch process to remove fins; and FIG. 15 is a cross-sectional side view after filling with oxide and performing a planarization process to reveal the final fins.

DETAILED DESCRIPTION

Figure 1:
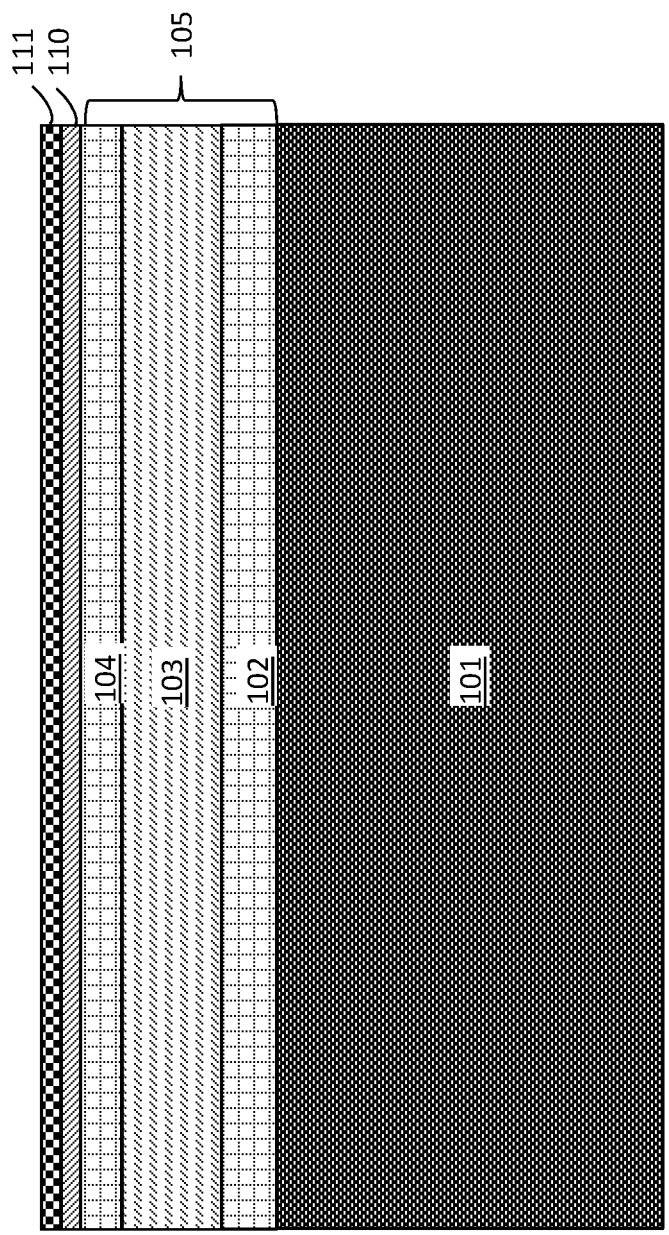

As devices scale to smaller dimensions, forming fins in FinFET devices may be challenging. In some devices, a uniform array of silicon (Si) fins is formed, followed by customization with another lithography process. One of the challenges comes from the overlay or misalignment problems in the customization lithography process. Some Directed Self-Assembly (DSA) methods use a self-aligned cut process in which the fins are customized before the Si fins are formed, e.g., at or before the hard mask etching. However this "cut first" scheme may result in iso/dense etch loading effect that may induce fin critical dimension (CD) non-uniformity, and hence, decreased device performance.

Accordingly, various embodiments described herein provide methods of making semiconductor devices that use a self-aligned process in which the fins are cut after etching the uniform array of Si fins. The methods create height and material differences in the hard mask layers over the substrate where the fins will be cut. After the uniform Si fin array is formed, some fins may be selectively removed using the hard mask height and material differences, along with the planarization and selective etching processes. By cutting the fins after the formation of Si fin array, the fins maintain CD uniformity. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

Turning now to the Figures, FIGS. 1-15 illustrate exemplary methods of making semiconductor devices according to various embodiments. FIG. 1 is a cross-sectional side view of a semiconductor stack that includes a neutral layer 111, an oxide layer 110, and a hard mask stack 105 disposed over a substrate 101.

Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates 101 include silicon-on-insulator (SOI) substrates with buried oxide (BOX) layers. The BOX layer is an oxide, for example silicon dioxide, or a nitride, for example, silicon nitride.

The substrate 101 thickness is not intended to be limited. In one embodiment, the substrate 101 includes a SOI and has a thickness in a range from about 5 nanometers (nm) to about 100 nm. In another embodiment, the substrate 101 includes bulk Si and has a thickness in a range from about 700 micrometers ($\mu$m) to about 800 $\mu$m. Yet, in other embodiments, the substrate 101 has a thickness about or in any range from about 0.1, 0.5, 1, 100, 250, 500, and 750 $\mu$m.

The hard mask stack 105 includes a first hard mask layer 102, a second hard mask layer 104, and an amorphous silicon layer 103 disposed between the first hard mask layer 102 and the second hard mask layer 104. The first hard mask layer 102 is disposed on the substrate 101 (in contact with the substrate 101). The first and second hard mask layers 102, 104 may be formed using a deposition process, including, but not limited to chemical vapor deposition (CVD), physical vapor deposition (PVD), plasma enhanced CVD (PECVD), atomic layer deposition (ALD), evaporation, chemical solution deposition, and/or other like processes.

The first and second hard mask layers 102, 104 may include a dielectric material, for example, an oxide, an oxide precursor, or a nitride. Non-limiting examples of materials for forming the first and second hard mask layers 102, 104 include silicon dioxide, silicon nitride, tetraethylorthosilicate (TEOS) oxide, high aspect ratio plasma (HARP) oxide, high temperature oxide (HTO), high density plasma (HDP) oxide, or any combination thereof. In some embodiments, the first and second hard mask layers 102, 104 include silicon nitride. In other embodiments, the first and second hard mask layers 102, 104 include the same or different material(s).

The thicknesses of the first and second hard mask layers 102, 104 generally vary and are not intended to be limited. In one embodiment, the thickness of the first and/or second hard mask layers 102, 104 is in a range from about 10 nm to about 200 nm. In another embodiment, the thickness of the first and/or second hard mask layers 102, 104 is in a range from about 20 nm to about 100 nm.

An amorphous silicon layer 103 is disposed on the first hard mask layer 102. The second hard mask layer 104 is disposed on the amorphous silicon layer 103.

In some embodiments, the amorphous silicon layer 103 is an oxide layer. When the layer 103 is an oxide, first and second hard mask layers 102, 104 are adjusted accordingly.

The amorphous silicon layer 103 may be deposited using a deposition process, including, but not limited to, PVD, CVD, PECVD, inductively coupled plasma chemical vapor deposition (ICP CVD), or any combination thereof.

The thickness of the amorphous silicon layer 103 generally varies and is not intended to be limited. In one embodiment, the thickness of the amorphous silicon layer 103 is in a range from about 20 nm to about 200 nm. In another embodiment, the thickness of the amorphous silicon layer 103 is in a range from about 50 nm to about 100 nm.

An oxide layer 110 is disposed on the second hard mask layer 104. The oxide layer 110 may be formed using processes including, but not limited to CVD, PVD, PECVD, ALD, chemical solution deposition, or other like processes. Non-limiting examples of materials for the oxide layer 110 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

The thickness of the oxide layer 110 generally varies and is not intended to be limited. In one embodiment, the thickness of the oxide layer 110 is in a range from about 3 nm to about 50 nm. In another embodiment, the thickness of the oxide layer 110 is in a range from about 5 nm to about 20 nm.

The neutral layer 111 is disposed on the oxide layer 110. The neutral layer 111 facilitates perpendicular morphology and directs the orientation of BCPs disposed above (see FIG. 4). The neutral layer 111 may be formed by spin-coating. The coated neutral layer 111 is annealed, and optionally, rinsed with a solvent. Non-limiting examples of materials for the neutral layer 111 include random copolymers of styrene and methylmethacrylate (MMA). In other embodiments, the neutral layer 111 includes a random copolymer that includes monomers that are included in the BCP 410, shown in FIG. 4. Yet, in other embodiments, the neutral layer 111 includes a material that facilitates perpendicular morphology and directs orientation of BCPs disposed above.

Figure 2:
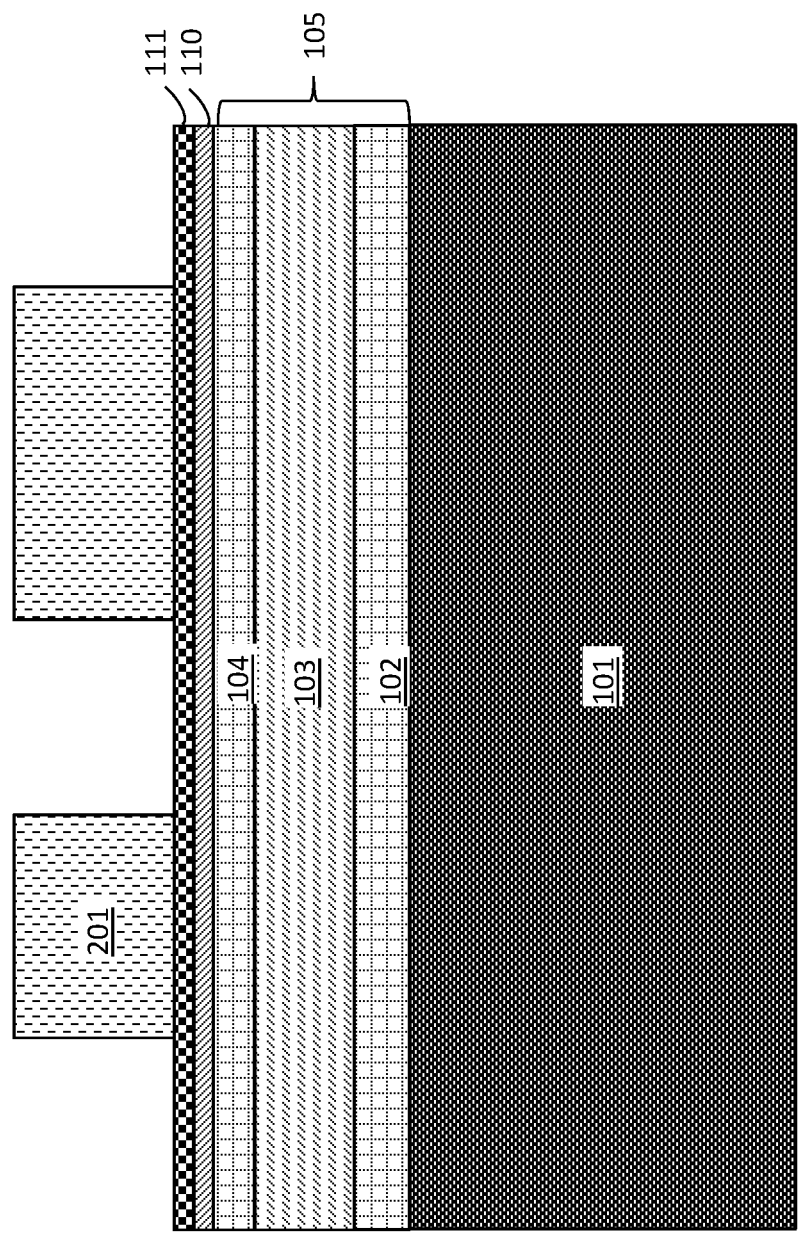

FIG. 2 is a cross-sectional side view after disposing a resist 201 on the neutral layer 111. The resist 201 may include, but is not limited to, a polymeric spin-on material or other polymeric material. The resist 201 is initially deposited as a layer on the neutral layer. The resist 201 may be, for example, a photoresist, an electron-beam resist, an ion-beam resist, an X-ray resist, an etch resist, or other like materials. The resist 201 is patterned, for example, by exposing the resist 201 layer to a desired pattern of radiation. The exposed resist is developed with a resist developer to provide a patterned resist 201 as shown in FIG. 2. The pattern of the resist 201 may then be transferred into layers beneath.

Although two discrete resists 201 are shown in FIG. 2, the resist 201 layer may be patterned as desired. Any number of resists, for example, one or more resists 201, may be used.

Figure 3:
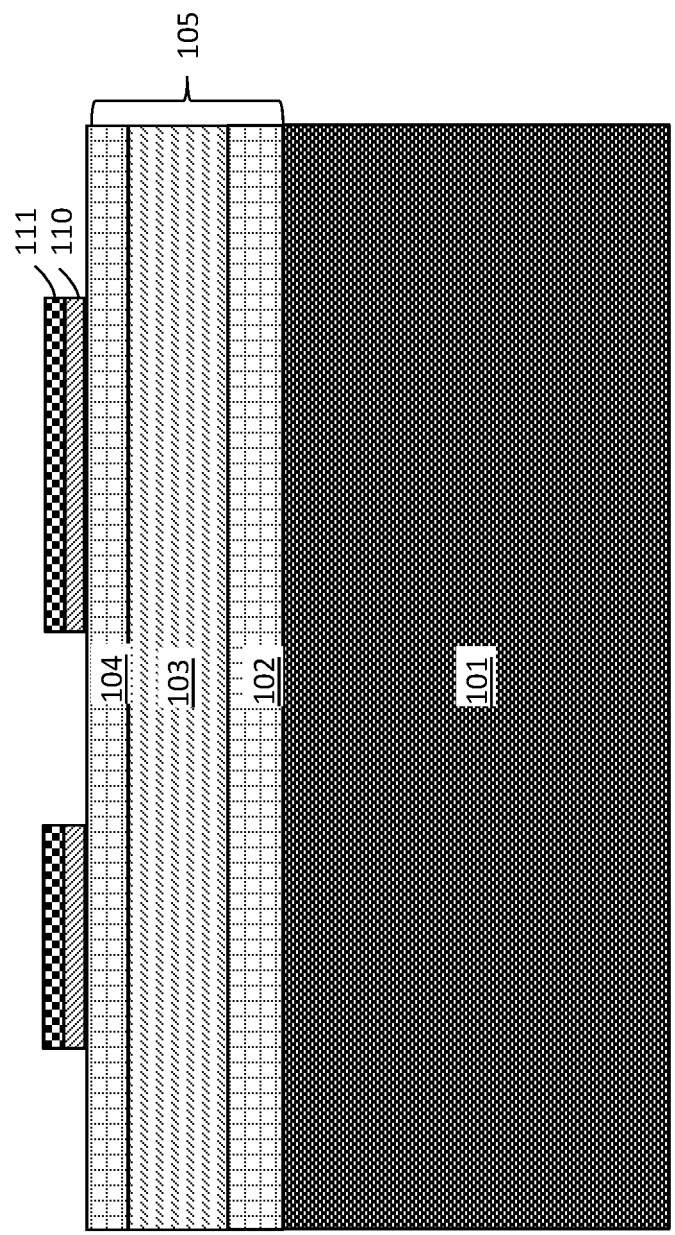

FIG. 3 is a cross-sectional side view after etching the neutral layer 111 and the oxide layer 110. The pattern of the resist 201 is transferred into the neutral layer 111 and the oxide layer 110. A portion of the oxide layer 110 and a portion of the neutral layer 111 are removed to expose a portion of the second hard mask layer 104.

At least one etch process is employed to transfer the resist 201 pattern into the neutral layer 111 and the oxide layer 110. The etch process stops on the second hard mask layer 104. The etch process employed may be, for example, a RIE process, a remote plasma, diluted HF, or chemical vapor/sublimation. Two sequential etch processes may be employed to etch the neutral layer 111 and the oxide layer 110.

The resist 201 is removed. The resist 201 may be removed using a solvent or aqueous developer, e.g., N-methyl-2-pyrrolidone (NMP), toluene, propylene glycol methyl ether acetate (PGMEA), or tetramethylammonium hydroxide (TMAH).

A functionalized polymer (referred to as the brush) is then spin-coated over second hard mask layer 104 and neutral layer 111 and annealed and solvent rinsed. Because the functional group on the brush does not react with the neutral layer 111, brush material will only form a monolayer of polymer on exposed second hard mask layer 104 after rinsing, i.e., layer 411 in FIG. 4. Patterned layer 110, neutral layer 111, and layer 411 will be referred to as the guiding pattern (GP) for DSA.

Figure 4:
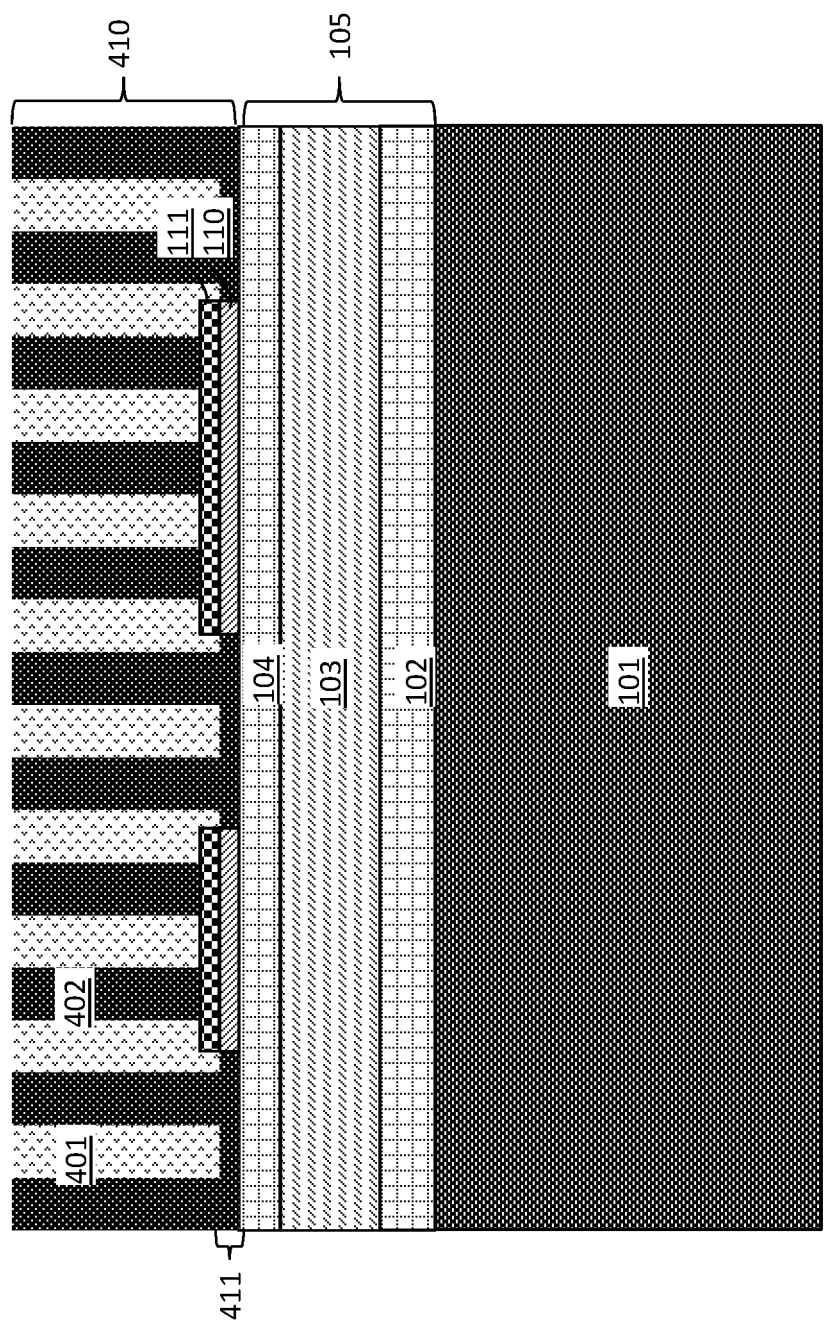

FIG. 4 is a cross-sectional side view after disposing (forming) a block copolymer (BCP) layer 410 on the GP. The BCP layer 410 includes a first polymer domain 401 and a second polymer domain 402. The first polymer domain 401 is composed of a first polymer. The second polymer domain 402 is composed of a second polymer. The first polymer is different from the second polymer. The BCP layer 410 is composed of self-assembled di-block copolymers. The BCP layer 410 includes alternating first polymer domains 401 and second polymer domains 402. The BCP 410 includes any number of alternating first and second polymer domains 401, 402.

In one embodiment, BCP 410 is a di-block copolymer that includes polystyrene (PS) and poly methyl methacrylate (PMMA). The first polymer domain 401 of the BCP 410 includes PMMA, and the second polymer domain 402 includes PS.

The BCPs are directed to self-assemble on the GP where the second polymer domain 402 self-aligns with layer 411.

Figure 5:
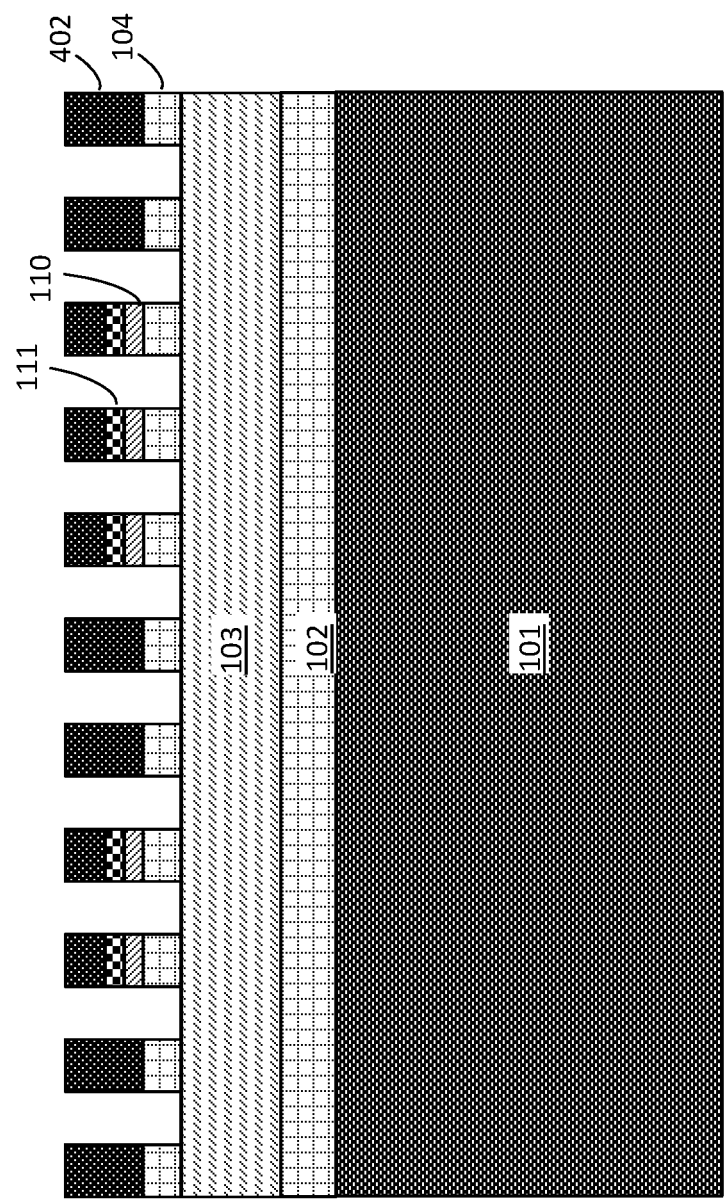

FIG. 5 is a cross-sectional side view after removing first polymer domain 401 from BCP 410. First polymer domain 401 may be removed by an etch process, for example, a dry etch process (e.g., reactive ion etch (RIE)) or a wet etch process (e.g., ultraviolet (UV) radiation followed by solvent rinsing). The remaining second polymer domain 402 of the BCP 410 forms an etch template for later pattern transfer processes.

After removing the first block 401, the second hard mask layer 104, oxide layer 110, and neutral layer 111 beneath the first block 401 (and between the second blocks 402) are also removed. The second block 402 defines the fin pattern that will be transferred into the substrate 101 beneath (see FIG. 8).

The second hard mask layer 104, oxide layer 110, and neutral layer 111 may be etched using the same etch process used to remove the first block 401 or one or more different etch processes. A dry etch process (e.g., RIE) may be used to remove the second hard mask layer 104, oxide layer 110, and neutral layer 111.

Figure 6:
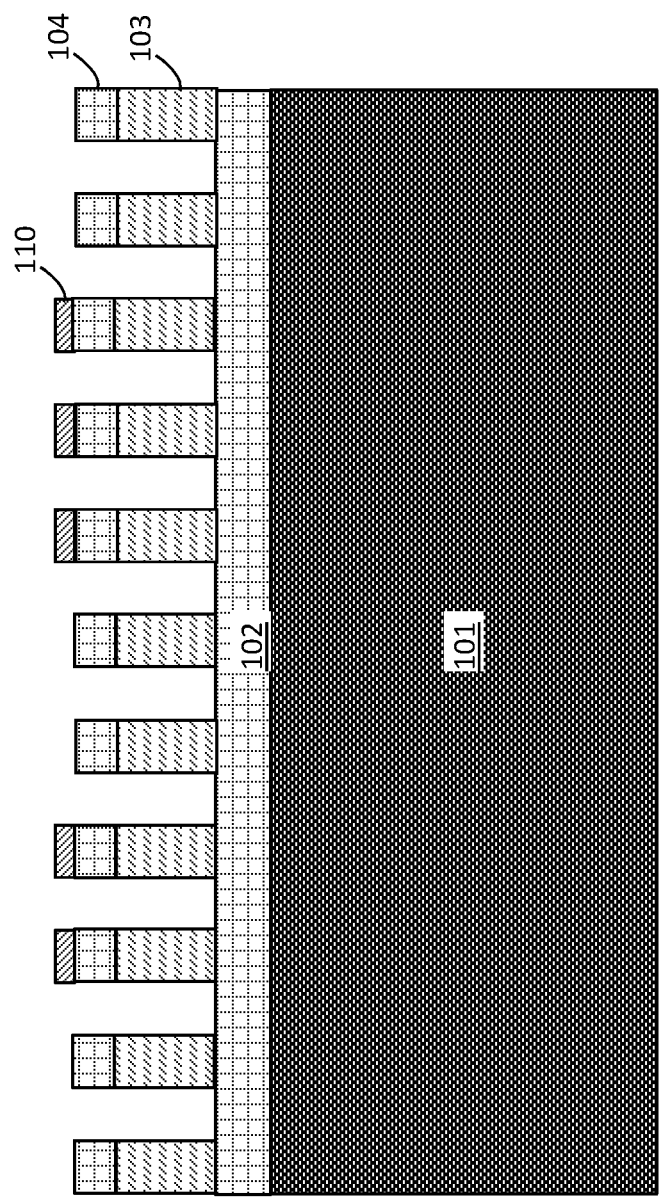

FIG. 6 is a cross-sectional side view after etching the amorphous silicon layer 103. The fin pattern defined by the second block 402 is transferred into the amorphous silicon layer 103. The etching process may be a dry etch process, for example, a plasma etch process. The etch process selectively stops on the first hard mask layer 102. The etching process employed also etches and consumes the second block 402.

Figure 7:
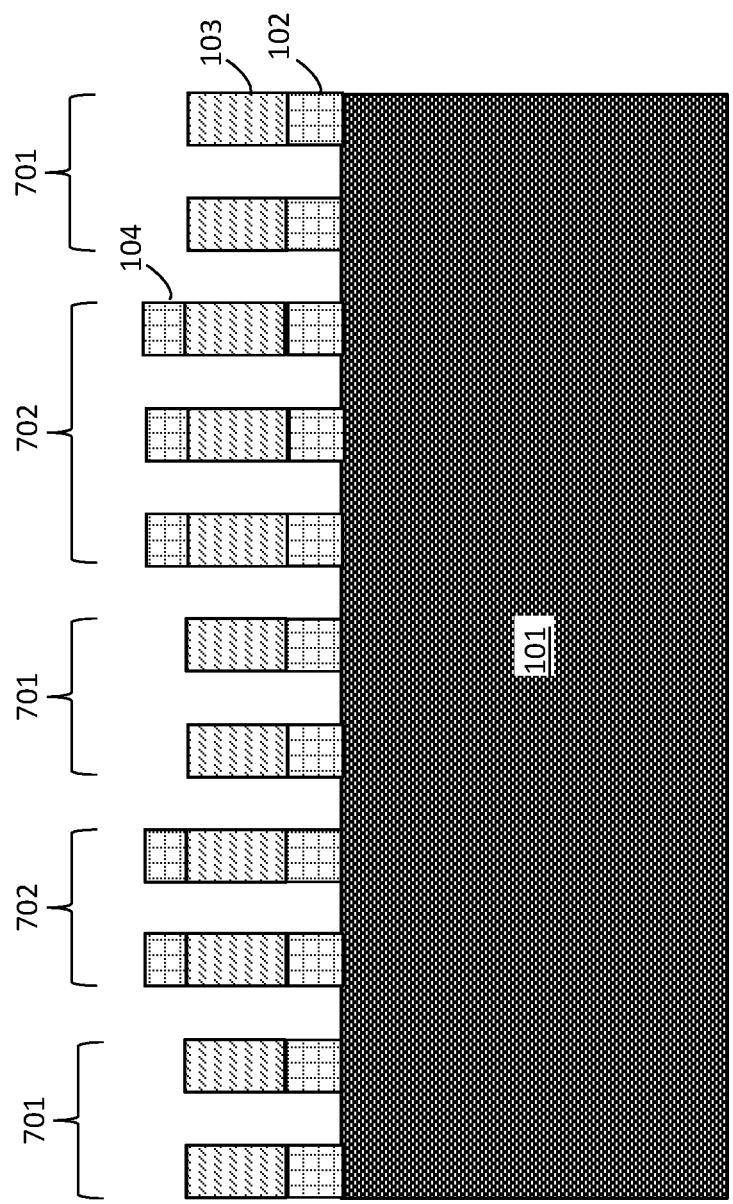

FIG. 7 is a cross-sectional side view after etching the first hard mask layer 102. The fin pattern defined by the second block 402 is transferred into the first hard mask layer 102. The first hard mask layer 102 is etched by performing a dry etch process, for example, a RIE process. The etch stops on the substrate 101.

Two different sets of hard masks are formed on the substrate 101, over the regions where the fins will later be formed (see FIG. 8). The first hard mask stacks 701 are shorter than the second hard mask stacks 702. First hard mask stack 701 includes first hard mask layer 102 and amorphous silicon layer 103. Second hard mask stack 702 includes first hard mask layer 102, amorphous silicon layer 103, and second hard mask layer 104.

Figure 8:
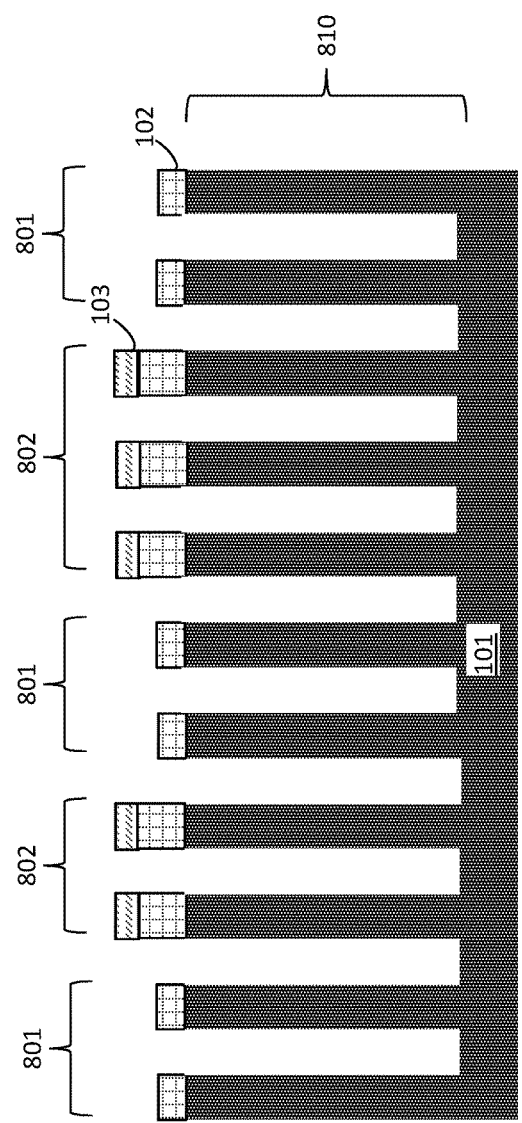

FIG. 8 is a cross-sectional side view after etching the substrate 101 to form fins 810. The etch process may be a dry etch process, for example, a plasma RIE process. Two different sets of fins are formed, first fins 801 and second fins 802.

The first and second hard mask stacks 701, 702 are etched together (see FIG. 7). However, because second hard mask stack 701 has amorphous Si as the top-most layer, while second hard mask stack 702 has an additional nitride layer, as a result, different materials and thicknesses of the hard mask layer were formed on first fins 801 and second fins 802. A portion of the amorphous silicon layer 103 and the first hard mask layer 102 remain on second fins 802. First fins 801 only have a portion of the first hard mask layer 102 disposed thereon.

First fins 801 include a portion (first portion) of the first hard mask layer 102. Second fins 802 include a portion of amorphous silicon layer 103 and the first hard mask layer 102. The portion of the first hard mask layer 102 on the first fins 801 is thinner than the portion of the first hard mask layer 102 on the second fins 802.

In some embodiments, the thickness of the portion of the first hard mask layer 102 on the first fins is in a range from about 10 nm to about 100 nm, and the thickness of the portion of the first hard mask layer 102 on the second fins 802 is in a range from about 10 nm to about 200 nm.

Figure 9:
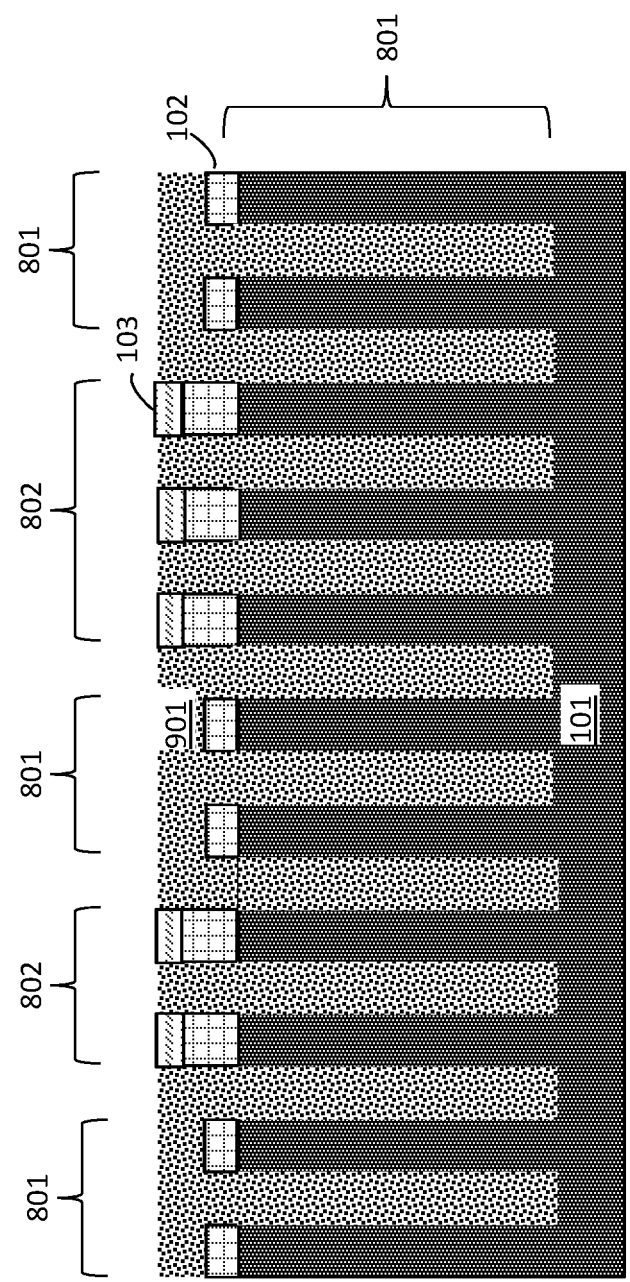

FIG. 9 is a cross-sectional side view after depositing a gap-filling oxide layer 901 on and between the fins 810. The oxide layer 901 is disposed on the first fins 801 and the second fins 802. The oxide layer 901 may be deposited using a deposition process, including, but not limited to CVD, PVD, PECVD, ALD, evaporation, chemical solution deposition, or like processes. Non-limiting examples of materials for the oxide layer 901 include low-k dielectric oxides, including but not limited to, silicon dioxide, spin-on-glass, flowable oxides, HDP oxides, or any combination thereof.

A planarization process, for example, a chemical mechanical planarization (CMP) process is employed to polish the surface of the oxide layer 901 and expose the amorphous silicon layer 103 on second fins 802. The shorter first fins 801 remain covered by the oxide layer 901.

Figure 10:
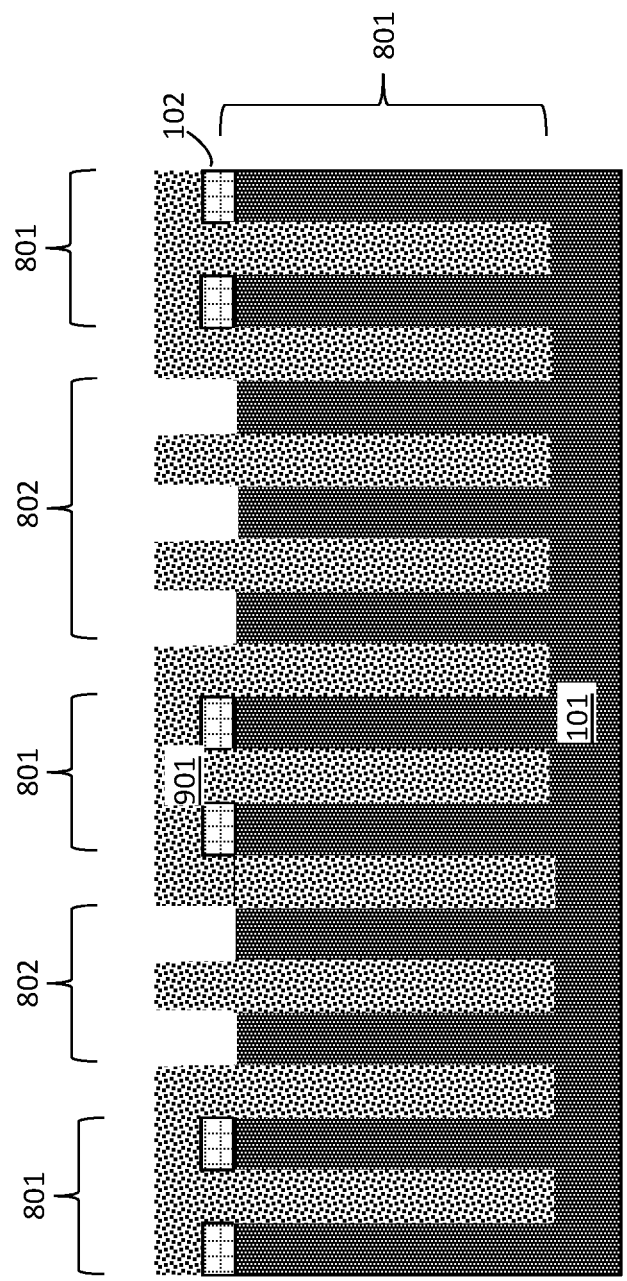

FIG. 10 is a cross-sectional side view after removing the portion of the amorphous silicon layer 103 and first hard mask layer 102 disposed on the second fins 802 (the taller fins). The amorphous silicon layer 103 may be removed by an etch process, for example, a dry etch process. The etch process may be a plasma RIE process or a remote plasma assisted dry etch process that includes simultaneous exposure to $H_2$, $NF_3$, and $NH_3$ plasma by-products (SiCoNi process). The etch process is selective for the amorphous silicon layer 103 and stops on the first hard mask layer 102.

The first hard mask layer 102 may be removed by a dry or wet etch process. The etch process is selective for the first hard mask layer 102 and stops on the substrate 101. The dry etch process may be a RIE process. The wet etch process may be hot phosphoric acid ($H_3PO_4$). The substrate 101 beneath second fins 802 is exposed between the oxide layers 901.

Figure 11:
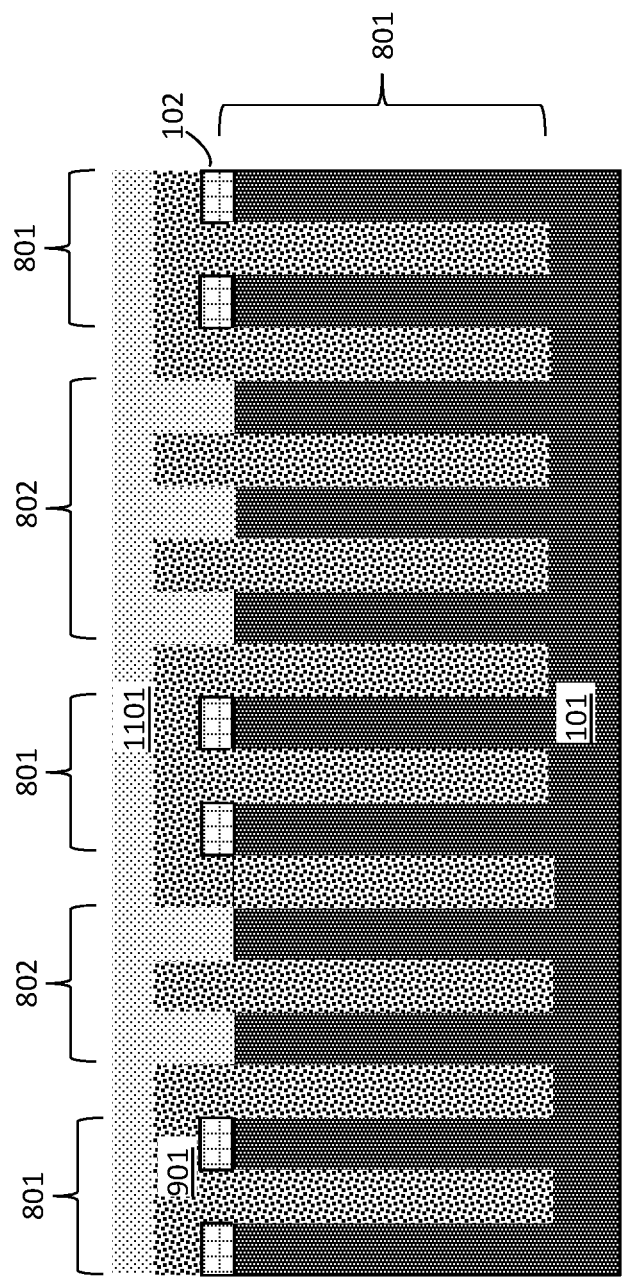

FIG. 11 is a cross-sectional side view after disposing a gap-filling insulating layer 1101 (third hard mask layer) on the oxide layer 901. The insulating layer 1101 contacts the substrate 101 of the second fins 802 and fills the gaps between the oxide layer 901 where the hard mask material was removed. The insulating layer 1101 may be deposited using a deposition process, for example, CVD, PVD, or a combination thereof.

The insulating layer 1101 may be a hard mask material. The insulating layer 1101 is deposited on the second fin 802. The insulating layer 1101 replaces the portion of the first hard mask layer 102 and the portion of the amorphous silicon layer 103 on the second fins 802.

The material forming insulating layer 1101 is different than material forming first hard mask layer 102. Non-limiting examples of materials for the insulating layer include silicon nitride, SiBCN, SiBN, SiCN, or any combination thereof.

Figure 12:
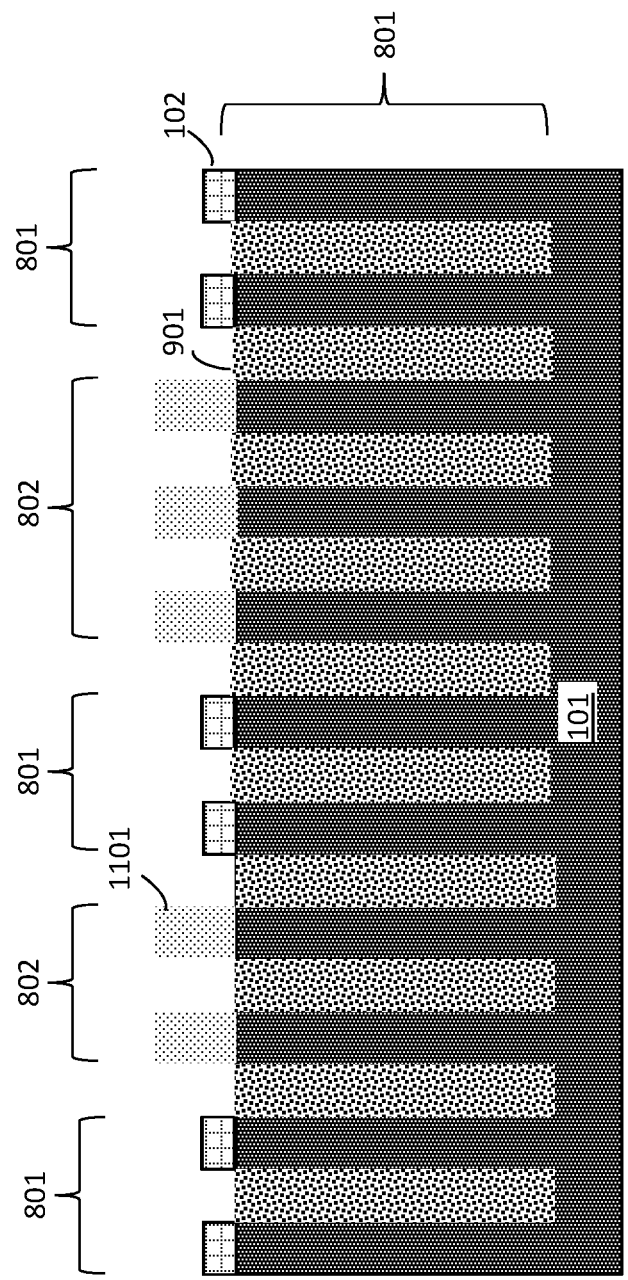

FIG. 12 is a cross-sectional side view after planarizing, for example, by CMP, the insulating layer 1101 (third hard mask layer) and etching the oxide layer 901 to expose the first hard mask layer 102 on first fins 801. The oxide layer 901 on first fins 801 is etched using, for example, a dry etch process (e.g., a plasma etch) or a wet etch process (e.g., a hydrofluoric acid (HF)) process.

A portion of the first hard mask layer 102 remains on first fins 801. Insulating layer 1101 (another hard mask material) remains on second fins 802. In some embodiments, the thickness of the insulating layer 1101 on second fins 802 is in a range from about 10 nm to about 100 nm, and the thickness of the first hard mask layer 102 on first fins 801 is in a range from about 10 nm to about 100 nm. In other embodiments, the thickness of the insulating layer 110 on second fins 802 is greater than the thickness of the first hard mask layer 102 on first fins 801.

Figure 13:
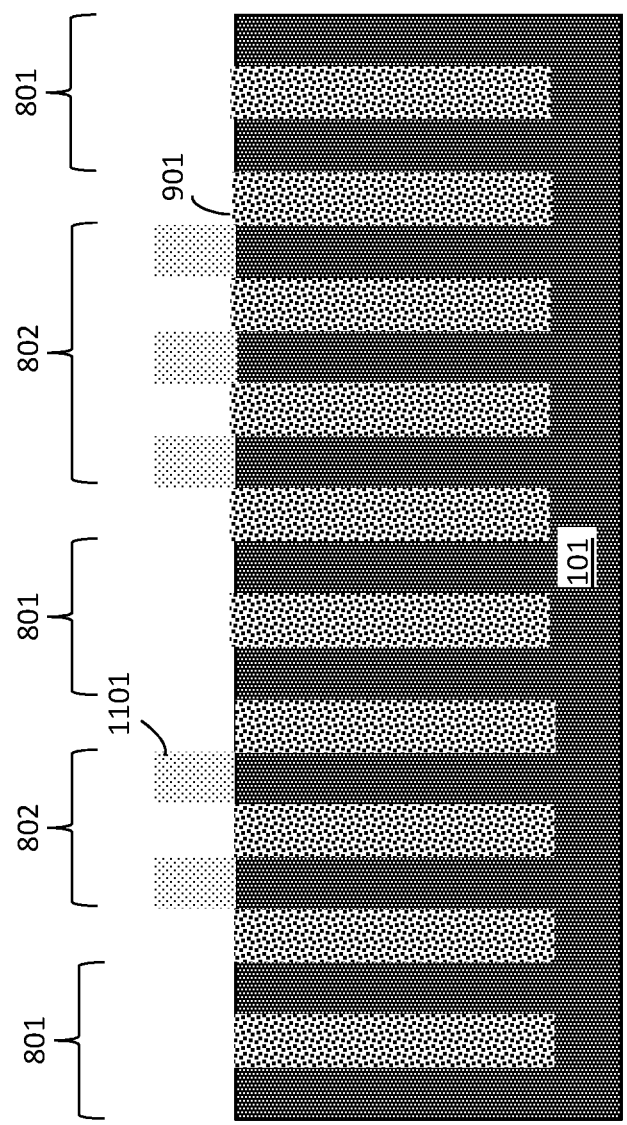

FIG. 13 is a cross-sectional side view after removing first hard mask layer 102 using a selective process. The selective process may be an etch process that selectively removes first hard mask layer 102, leaving insulating layer 1101 substantially intact on second fins 802. The selective etch process may be a wet etch process. When first hard mask layer 102 is silicon nitride, for example, HF diluted with ethylene glycol (HFEG) may be employed.

The substrate 101 material of first fins 801 is exposed after first hard mask layer 102 is removed. Second fins 802 include insulating layer 1101 disposed on the substrate 101 material.

Figure 14:
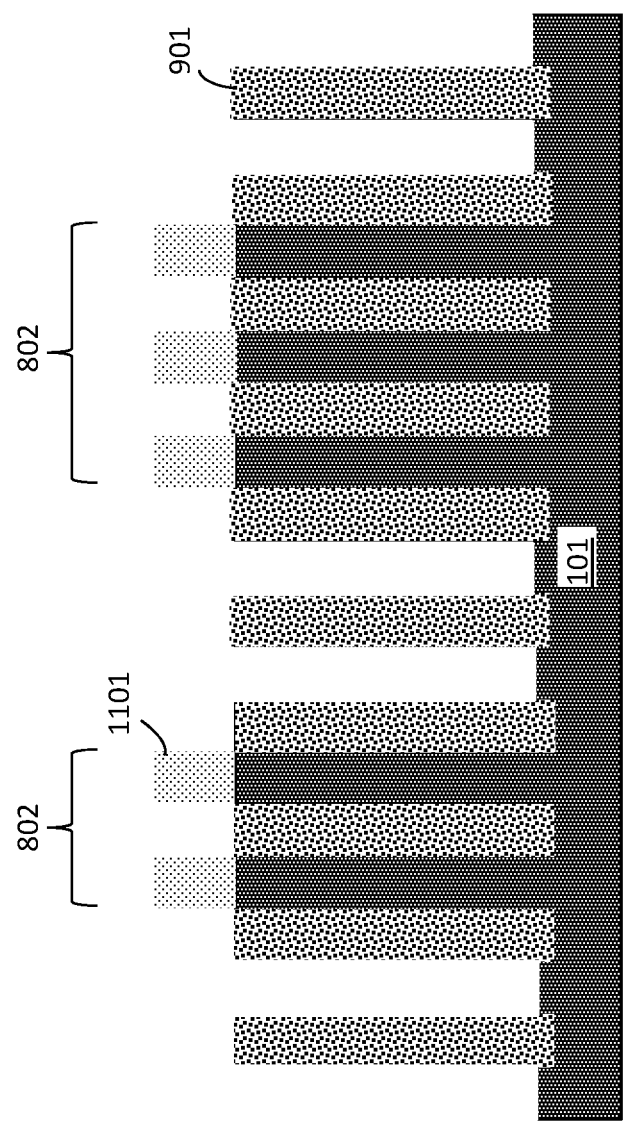

FIG. 14 is a cross-sectional side view after etching the substrate 101 using a selective etch process. The etch process selectively removes the substrate 101 material between the oxide layer 901 and removes first fins 801 (i.e., fin cut of first fins 801). The etch process may be a dry etch process, for example, a remote plasma etch process. Second fins 802 are protected by insulating layer 1101. Only substrate 101 material of first fins 801 is removed.

Figure 15:
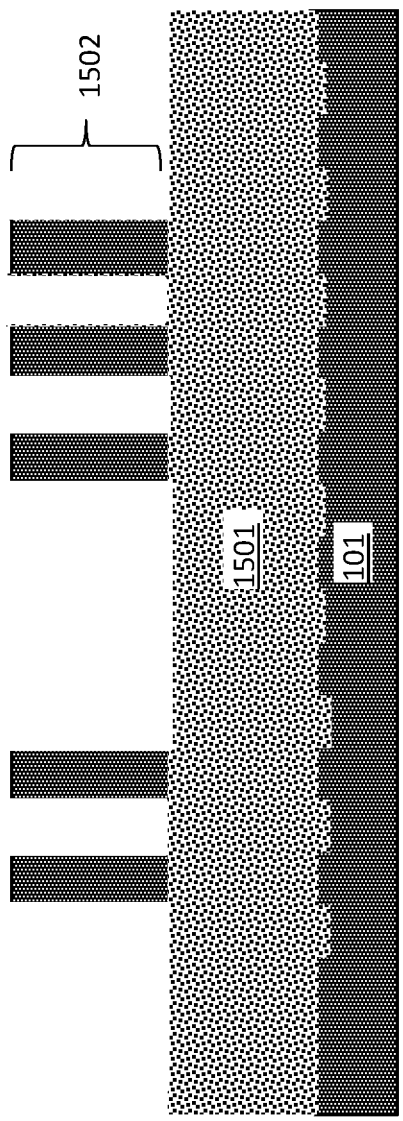

FIG. 15 is a cross-sectional side view after filling with oxide 1501 and performing a planarization process and an etch process to reveal the final fins 1502. The oxide 1501 may include the same oxide material is oxide layer 901. The oxide 1501 may include a different oxide material than oxide layer 901. The oxide 1501 may be deposited using a deposition process, including, but not limited to CVD, PVD, PECVD, ALD, evaporation, chemical solution deposition, or like processes. Non-limiting examples of materials for oxide 1501 include low-k dielectric oxides, including but not limited to, silicon dioxide, spin-on-glass, flowable oxides, HDP oxides, or any combination thereof.

A planarization process, for example, a CMP process, polishes/etches the surface of the oxide 1501 and exposes layer 1101. A plasma etch, diluted HF, or chemical vapor/sublimation may be used to reveal the top portion of 802. The final fins 1502 are thus derived from second fins 802.

As described above, various embodiments described herein provide methods of making semiconductor devices that use a self-aligned process in which the fins are etched/cut after etching the array of Si fins. The methods create height and material differences in the hard mask layers over the substrate where the fins will be cut. After utilizing the material/height differences to selectively expose some of the Si fins, the exposed fins may be selectively removed. By cutting the fins after the formation of the uniform Si fin array, the fins maintain CD uniformity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method of making a semiconductor device, the method comprising:
   disposing a hard mask stack on a substrate, the hard mask stack comprising a first hard mask layer in contact with the substrate, an amorphous silicon layer on the first hard mask layer, and a second hard mask layer on the amorphous silicon layer;
   disposing an oxide layer and a neutral layer on the second hard mask layer;
   removing a portion of the oxide layer and the neutral layer to expose a portion of the second hard mask layer;
   forming a guiding pattern by selectively backfilling a polymeric material in the exposed portion of the second hard mask layer;
   forming a self-assembled block copolymer layer on the guiding pattern, the guiding pattern comprising the neutral layer and the polymeric material that is backfilled;
   removing a portion of the block copolymer layer to form an etch template with the polymeric material that is remaining;
   etching the neutral layer, the oxide layer, the second hard mask layer, the amorphous silicon layer, and the first hard mask layer to transfer a pattern from the etch template into the neutral layer, the oxide layer, the second hard mask layer, the amorphous silicon layer, and the first hard mask layer;
   etching the substrate to transfer the pattern from the hard mask stack into the substrate and form a first fin comprising a first portion of the first hard mask layer disposed on the first fin and a second fin comprising a second portion of the first hard mask layer disposed on the second fin, the second portion being thicker than the first portion;
   replacing the second portion of the first hard mask layer on the second fin with a third hard mask material; and
   etching to remove the first fin.

2. The method of claim 1, wherein the second fin further comprises a portion of the amorphous silicon layer on the second portion of the first hard mask layer.

3. The method of claim 2, wherein the portion of the amorphous silicon layer is replaced with the third hard mask material.

4. The method of claim 1, wherein the first hard mask layer comprises silicon nitride.

5. The method of claim 4, wherein the second hard mask layer comprises silicon nitride.

6. The method of claim 1, wherein replacing the second portion of the first hard mask layer comprises a selective etch process.

7. The method of claim 1, wherein the first hard mask layer is different than the third hard mask material.

8. The method of claim 1, wherein the third hard mask material is SiBCN, SiBN, SiCN, or a combination thereof.

9. The method of claim 1, wherein the substrate comprises silicon, germanium, silicon carbide, gallium arsenide, indium arsenide, indium phosphide, or any combination thereof.

10. The method of claim 1, wherein etching to remove the first fin is a selective etch process that selectively removes material of the first fin.

11. A method of making a semiconductor device, the method comprising:
    disposing a hard mask stack on a substrate, the hard mask stack comprising a first hard mask layer in contact with the substrate, an amorphous silicon layer on the first hard mask layer, and a second hard mask layer on the amorphous silicon layer;
    disposing an oxide layer and a neutral layer on the second hard mask layer;
    removing a portion of the oxide layer and the neutral layer to expose a portion of the second hard mask layer;
    forming a guiding pattern by selectively backfilling a polymeric material in the exposed portion of the second hard mask layer;
    forming a self-assembled block copolymer layer on the guiding pattern, the guiding pattern comprising the neutral layer and the polymeric material that is backfilled, the self-assembled block copolymer layer comprising polystyrene (PS) and poly methyl methacrylate (PMMA);
    removing a portion of the block copolymer layer to form an etch template with the polymeric material that is remaining;
    etching the neutral layer, the oxide layer, the second hard mask layer, the amorphous silicon layer, and the first hard mask layer to transfer a pattern from the etch template into the neutral layer, the oxide layer, the second hard mask layer, the amorphous silicon layer, and the first hard mask layer;
    etching the substrate to transfer the pattern from the hard mask stack into the substrate and form a first fin comprising a first portion of the first hard mask layer disposed on the first fin and a second fin comprising a second portion of the first hard mask layer disposed on the second fin, the second portion being thicker than the first portion;
    replacing the second portion of the first hard mask layer on the second fin with a third hard mask material; and
    etching to remove the first fin.

12. The method of claim 11, wherein the second fin further comprises a portion of the amorphous silicon layer on the second portion of the first hard mask layer.

13. The method of claim 12, wherein the portion of the amorphous silicon layer is replaced with the third hard mask material.

14. The method of claim 11, wherein the first hard mask layer comprises silicon nitride.

15. The method of claim 14, wherein the second hard mask layer comprises silicon nitride.

16. The method of claim 11, wherein replacing the second portion of the first hard mask layer comprises a selective etch process.

17. The method of claim 11, wherein the first hard mask layer is different than the third hard mask material.

18. The method of claim 11, wherein the third hard mask material is SiBCN, SiBN, SiCN, or a combination thereof.

19. The method of claim 11, wherein the substrate comprises silicon, germanium, silicon carbide, gallium arsenide, indium arsenide, indium phosphide, or any combination thereof.

20. The method of claim 11, wherein etching to remove the first fin is a selective etch process that selectively removes material of the first fin.

* * * * *